US011963283B2

(12) United States Patent
Cha et al.

(10) Patent No.: US 11,963,283 B2
(45) Date of Patent: Apr. 16, 2024

(54) ELECTRIC RANGE

(71) Applicant: LG ELECTRONICS INC., Seoul (KR)

(72) Inventors: Jungmin Cha, Seoul (KR); Il Young Park, Seoul (KR); Seunghak Kim, Seoul (KR); Myoeng Soo Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 406 days.

(21) Appl. No.: 17/199,755

(22) Filed: Mar. 12, 2021

(65) Prior Publication Data

US 2021/0289592 A1    Sep. 16, 2021

(30) Foreign Application Priority Data

Mar. 12, 2020    (KR) .......................... 10-2020-0030998

(51) Int. Cl.
*H05B 6/12* (2006.01)
*H01H 37/76* (2006.01)
*H05K 5/00* (2006.01)
*H05K 5/02* (2006.01)

(52) U.S. Cl.
CPC .......... *H05B 6/1209* (2013.01); *H01H 37/76* (2013.01); *H05B 6/1263* (2013.01); *H05K 5/0091* (2013.01); *H05K 5/0217* (2013.01); *H05K 5/0247* (2013.01); *H05B 2206/022* (2013.01); *H05B 2213/07* (2013.01)

(58) Field of Classification Search
CPC .. H05B 6/1209; H05B 2213/07; H05B 6/062; H05B 6/1263; H05B 2206/02; H01H 37/76; H05K 5/0091; H05K 5/0217; H05K 5/0247
See application file for complete search history.

(56) References Cited

U.S. PATENT DOCUMENTS

2018/0376545 A1\* 12/2018 Hwangbo ............. H05B 6/065
2019/0234616 A1    8/2019 Yang

FOREIGN PATENT DOCUMENTS

JP           2006209987 A  *  8/2006
KR    10-2014-0124106        10/2014
KR    10-2014-0131118        11/2014

(Continued)

OTHER PUBLICATIONS

Electrical insulation, energyeducation.ca/encyclopedia/Electrical_insulation, Mar. 2018 (Year: 2018).*

(Continued)

*Primary Examiner* — Brian W Jennison
(74) *Attorney, Agent, or Firm* — KED & ASSOCIATES, LLP

(57) ABSTRACT

An electric range is provided that may include an elastic holder to fix a fuse and a sensor in a central portion of an induction heating unit disposed over/on/in an upper portion of a base plate, thereby stably fixing the fuse and sensor against external impact. In the electric range, an upper end of the sensor may come into close contact with a lower surface of a cover plate disposed over/on/in an upper portion of the induction heating unit, thereby stably measuring a temperature of the cover plate and absorbing an external impact.

13 Claims, 13 Drawing Sheets

(56) References Cited

FOREIGN PATENT DOCUMENTS

| KR | 20140131118 A | * | 11/2014 |
| KR | 10-2016-0025170 | | 3/2016 |
| KR | 20160025170 A | * | 3/2016 |
| WO | WO 2008/155922 | | 12/2008 |

OTHER PUBLICATIONS

European Search Report dated Aug. 9, 2021 issued in EP Application No. 21162033.1.

* cited by examiner

ELECTRIC RANGE

CROSS-REFERENCE TO RELATED APPLICATION(S)

This application claims priority under 35 U.S.C. § 119 to Korean Application No. 10-2020-0030998 filed on Mar. 12, 2020, whose entire disclosure(s) is/are hereby incorporated by reference.

BACKGROUND

1. Field

An electric range is disclosed herein.

2. Background

Various types of cooking appliances are used to heat food or other items (hereinafter, collectively "food") at homes or restaurants. The cooking appliances include gas ranges using gas and electric ranges using electricity.

The electric ranges are classified as resistance heating-type electric ranges and induction heating-type electric ranges. In a resistance heating method, electric current is supplied to a metallic resistance wire or a non-metallic heat generation element, such as silicon carbide to generate heat, and the generated heat is radiated or conducted to heat an object to be heated, for example, a cooking vessel, such as a pot, or a frying pan, for example. In an induction heating method, high-frequency power is supplied to a coil to generate a magnetic field around the coil, and eddy current produced in the generated magnetic field is used to heat an object to be heated made of a metallic material.

When electric current is supplied to a working coil or a heating coil, heat is generated while an object to be heated is inductively heated. The object to be heated is heated by the generated heat.

An electric range of the related art, having the above configuration, includes a main body, a working coil, and a cover plate. A substrate is disposed in the main body. A base plate is disposed at an upper end of the main body.

The working coil is disposed at an upper end of the base plate. The working coil has an insulation sheet and a ferrite. The working coil is disposed on the insulation sheet. The ferrite is disposed on the base plate.

The cover plate is disposed on the main body. The cover plate is disposed over/on/in an upper portion of the working coil. An object to be heated is placed onto the cover plate.

Based on the above configuration, the working coil forms a magnetic field when electric current flows. Based on the induction heating method, the magnetic field heats the cooking vessel, placed on the cover plate, to heat an object to be cooked accommodated in the cooking vessel. The substrate controls supply of induced current to the working coil.

The electric range of the related art having the above configuration includes a temperature fuse used to control temperature when the electric range overheats. The temperature fuse is disposed on a working coil base constituting the working coil.

A working coil base of the related art has a holder in which a temperature fuse is installed. The holder, which prevents the temperature fuse from escaping or tilting when an impact occurs to an induction range or an induction range is moved, is disclosed in Korean Patent Publication No. 10-2016-0025170, which is hereby incorporated by reference.

The holder of the related art has a structure in which a temperature fuse is inserted into the holder. The holder has an additional escape prevention guide for prevention of an escape of the temperature fuse. When the temperature fuse is inserted and installed in the holder during assembly of an electric range, insertion of the temperature fuse may be prevented by the escape prevention guide, causing difficulty in assembly.

The temperature fuse of the related art comes into close contact with a lower end of the cover plate made of glass. When an external impact is applied to the cover plate, the impact is directly delivered to the temperature fuse in close contact with the cover plate. Thus, the temperature fuse and the glass-based cover plate may be damaged by the impact.

In the related art, a temperature sensor for measuring a temperature of the cover plate is installed in a main body as a component in addition to the temperature fuse. As the temperature fuse and the temperature sensor are respectively installed, efficient assembly cannot be ensured.

Additionally, when an external impact is applied to the cover plate, the temperature sensor cannot absorb the impact, resulting in an operational error or damage of the temperature sensor. Thus, when the temperature sensor overheats in a state of being broken, the temperature fuse may be blown.

BRIEF DESCRIPTION OF THE DRAWINGS

Embodiments will be described in detail with reference to the following drawings in which like reference numerals refer to like elements, and wherein.

DETAILED DESCRIPTION

Figure 1:
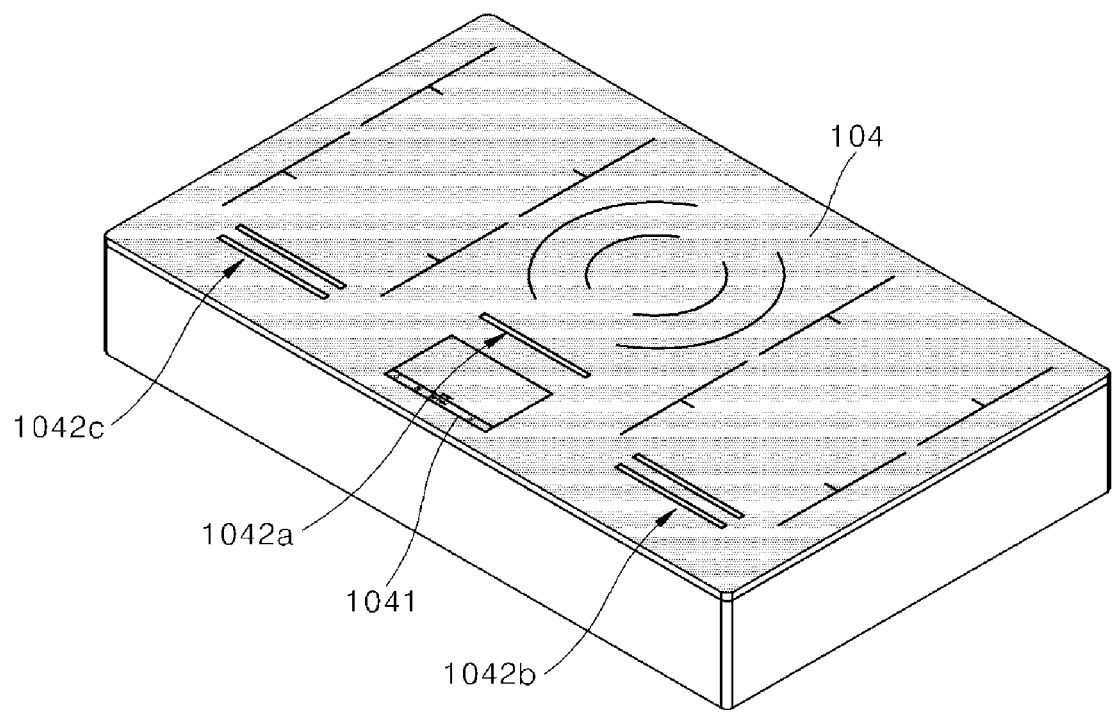
FIG. 1 is a perspective view of an electric range according to an embodiment.

Embodiments are described hereinafter with reference to the accompanying drawings such that one having ordinary skill in the art to which the embodiments pertain may easily implement the technical idea. In the disclosure, description of known technologies in relation to the disclosure is omitted if it is deemed to make the gist unnecessarily vague. In the drawings, the same or like reference numerals denote the same or like components.

The terms "first", "second" and the like are used herein only to distinguish one component from another component. Thus, the components should not be limited by the terms. Certainly, a first component can be a second component unless stated to the contrary.

When one component is described as being "in an upper portion (or a lower portion)" of another component, or "on (or under)" another component, one component can be placed on the upper surface (or under the lower surface) of another component, and an additional component may be interposed between another component and one component on (or under) another component.

When one component is described as being "connected", "coupled", or "connected" to another component, one component can be directly connected, coupled or connected to another component; however, it is also to be understood that an additional component can be "interposed" between the two components, or the two components can be "connected", "coupled", or "connected" through an additional component.

Hereinafter, each component may be provided as a single one or a plurality of ones, unless explicitly stated to the contrary.

The singular forms "a", "an" and "the" are intended to include the plural forms as well, unless explicitly indicated otherwise. It should be further understood that the terms "comprise" or "have," set forth herein, are not interpreted as necessarily including all the stated components or steps but can be interpreted as including some of the stated components or steps or can be interpreted as further including additional components or steps.

Hereinafter, the terms "A and/or B" as used herein can denote A, B or A and B, and the terms "C to D" can denote C or greater and D or less, unless stated to the contrary.

Hereinafter, an electric range is described with reference to several embodiments. The electric range disclosed herein may include an electric resistance-type electric range and an induction heating-type electric range, for example, an induction heating device. For convenience, an induction heating device, provided with a working coil as a heating unit, is described as an example during description of the embodiments. However, embodiments are not limited to those set forth herein.

FIG. 1 is a perspective view of an electric range 100 according to an embodiment. FIGS. 2 to 5 are perspective views of the electric range 100 in FIG. 1 without some components.

Figure 2:
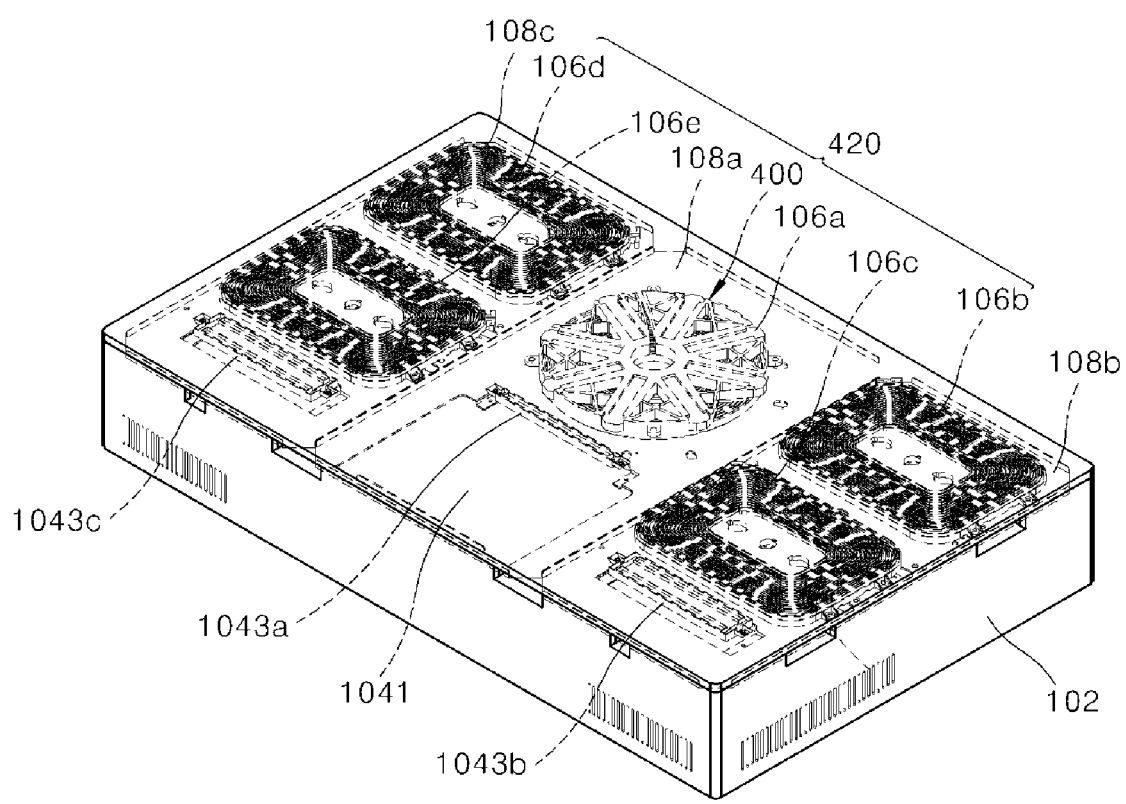
FIGS. 2 to 5 are perspective views of the electric range in FIG. 1 without some components.
Figure 3:
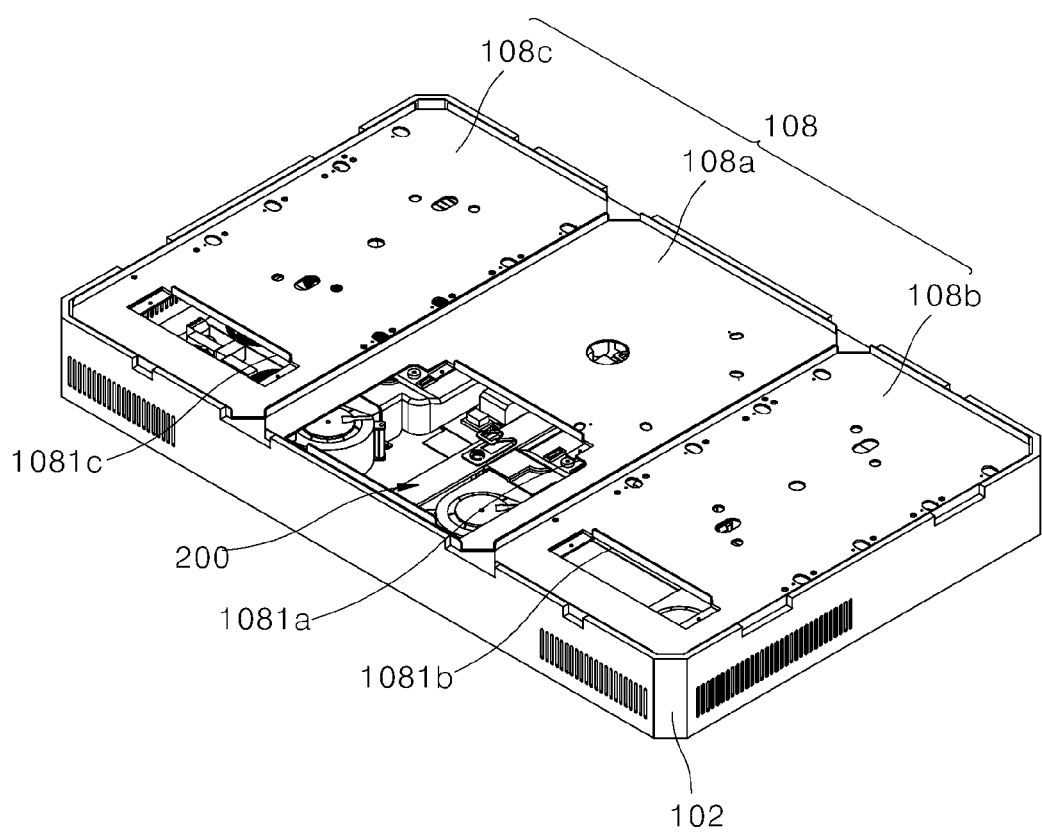
Figure 4:
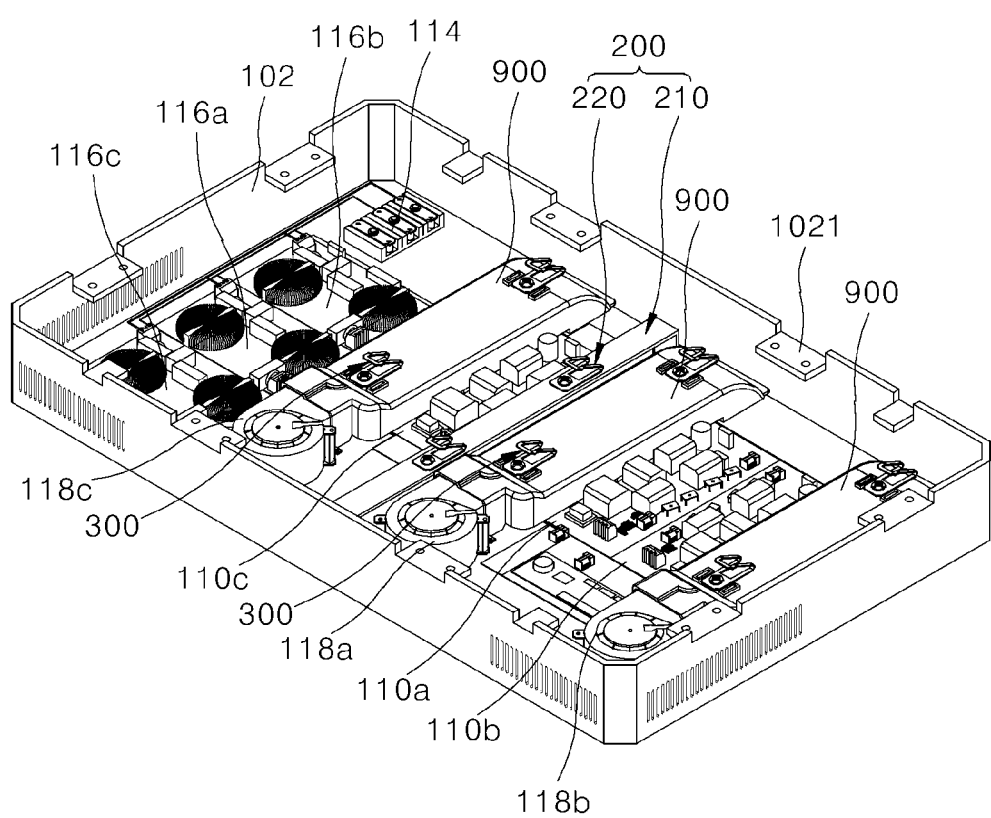
Figure 5:
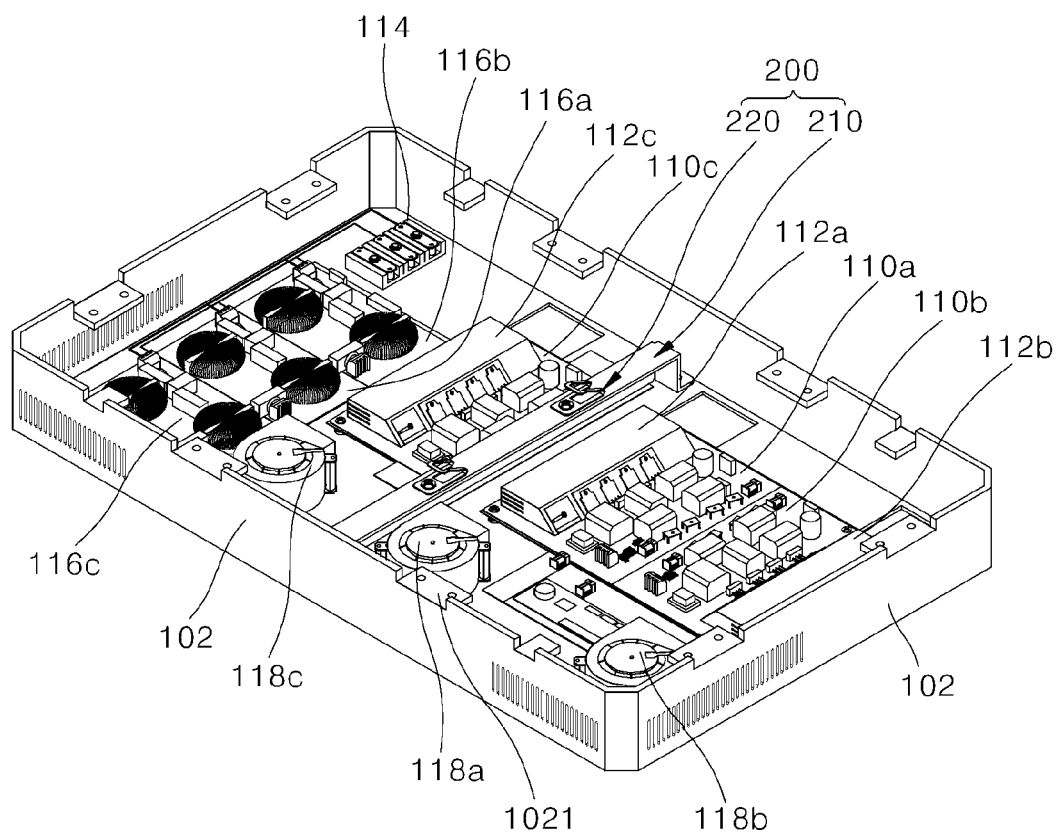

More specifically, FIG. 2 is a view showing the electric range 100 in FIG. 1 without cover plate 104, FIG. 3 is a view showing the electric range 100 in FIG. 1 without cover plate 104 and working coil 420, FIG. 4 is a view showing the electric range 100 in FIG. 1 without cover plate 104, working coil 420, and one or more base plate 108a, 108b, 108c, and FIG. 5 is a view showing the electric range 100 in FIG. 1 without cover plate 104, working coil 420, one or more base plate 108a, 108b, 108c, and one or more air guide 900.

Referring to FIGS. 1 to 5, the electric range 100 according to an embodiment may include a case 102, the cover plate 104, the working coil 420, one or more base plate 108a, 108b, 108c, one or more drive circuit 110a, 110b, 110c, one or more heat sink 112a, 112b, 112c, a power feeder 114, one or more filter circuit 116a, 116b, 116c, one or more air blowing fan 118a, 118b, 118c, and one or more air guide 900. The case 102 may protect components in the electric range 100. For example, the case 102 may be made of aluminum; however, embodiments are not limited thereto.

The case 102 may be thermally insulated to prevent heat, generated by the working coil 420, from leaking outward.

The cover plate 104 may be coupled to an upper end of the case 102 to shield an inside of the case 102, and an object to be heated (not illustrated, an object to be heated by the working coil 420) may be placed on an upper surface of the cover plate 104.

An object to be heated, such as a cooking vessel, may be placed on the upper surface of the cover plate 104, and heat generated by the working coil 420 may be delivered to the object to be heated through the upper surface of the cover plate 104. The cover plate 104 may be made of glass; however, embodiments are not limited thereto.

An input interface 1041 configured to receive an input from a user may be disposed on the upper surface of the cover plate 104. The input interface 1041 may be recessed into the upper surface of the cover plate 104 in a flat manner and may display a specific image. The input interface 1041 may receive a touch input from the user, and the electric range 100 may be driven based on the received touch input.

More specifically, the input interface 1041 may be a module for inputting a heating intensity or a heating period, for example, desired by the user, and may be implemented as a physical button or a touch panel, for example. Additionally, the input interface 1041 may display a drive state of the electric range 100. For example, the input interface 1041 may be a thin film transistor liquid crystal display (TFT LCD); however, embodiments are not limited thereto.

One or more light display area 1042a, 1042b, 1042c may be formed on the upper surface of the cover plate 104. One or more light source unit (lighting unit) 1043a, 1043b, 1043c may be disposed below/under the cover plate 104, and light emitted from the one or more light source unit 1043a, 1043b, 1043c may be delivered to the user through the one or more light display area 1042a, 1042b, 1042c.

The working coil 420 may be a heating unit that heats an object to the heated, and may be disposed in the case 102. The working coil 420 may include a wire wound multiple times in a ring shape, and may generate an alternating current (AC) magnetic field. Additionally, a mica sheet and a ferrite core may be consecutively disposed on a lower side of the working coil 420.

The ferrite core may be fixed to the mica sheet via a sealant, and may diffuse the AC magnetic field generated by the working coil 420. The mica sheet may be fixed to the working coil 420 and the ferrite core via the sealant, and may prevent direct delivery of the heat, generated by the working coil 420, to the ferrite core.

A plurality of working coils 420 may be provided. The plurality of working coils 420 may include first working coil 106a disposed at a central portion of the case 102, second working coil 106b and third working coil 106c disposed on a right (first) side of the first working coil 106a, and fourth working coil 106d and fifth working coil 106e disposed on a left (second) side of the first working coil 106a. The second working coil 106b and the third working coil 106c may be disposed on the right side of the first working coil 106a in a frontward-rearward direction, and the fourth working coil 106d and the fifth working coil 106e may be disposed on the left side of the first working coil 106a in the frontward-rearward direction.

For example, the first working coil 106a may be a high-output dual heating coil, and the second working coil 106b, the third working coil 106c, the fourth working coil 106d, and the fifth working coil 106e may be a single heating coil. The first working coil 106a as a dual heating coil may be heavy and may have a maximum output of 7000 kW.

The electric range 100 according to an embodiment may perform the function of wireless power transmission based on configurations and features described above.

Technologies for wirelessly supplying power have been developed and have been used for a wide range of electronic devices. A battery of an electronic device, to which the wireless power transmitting technology is applied, can be charged only by being placed on a charge pad without connecting to an additional charge connector. Accordingly, the electronic device, to which the wireless power transmitting technology is applied, requires no cord or no charger, thereby ensuring improved mobility and a reduced size and weight.

The wireless power transmitting technology can be broadly classified as an electromagnetic induction technology using a coil, a resonance technology using resonance, and a radio emission technology for converting electric energy into microwaves and delivering the microwaves, for example. In the electromagnetic induction technology, power is transmitted using electromagnetic induction between a primary coil, that is, a working coil, included in an apparatus for wirelessly transmitting power and a secondary coil included in an apparatus for wirelessly receiving power.

The theory of the induction heating technology of the electric range 100 is substantially the same as that of the electromagnetic induction-based wireless power transmission technology, in that an object to be heated is heated using electromagnetic induction. Accordingly, the electric range 100 according to an embodiment may perform the function of wireless power transmission as well as the function of induction heating.

The one or more base plate 108a, 108b, 108c may be disposed at a middle of the case 102, and the plurality of working coils 420 may be disposed on the one or more base plate 108a, 108b, 108c. The one or more base plate 108a, 108b, 108c may support the plurality of working coils 420, which are heavy, and may help the plurality of working coils 420 to be mounted. The input interface 1041 and the light source units 1043a, 1043b, 1043c may be further disposed at the upper portion of the one or more base plate 108a, 108b, 108c.

According to an embodiment, a plurality of base plates 108a, 108b, 108c may be provided; however, embodiments are not limited thereto. Alternatively, a single base plate may be disposed in the case 102.

The plurality of base plates 108a, 108b, 108c may include first base plate 108a, second base plate 108b, and third base plate 108c. The first base plate 108a, the second base plate 108b, and the third base plate 108c may be disposed at the middle of the case 102 side by side.

The first base plate 108a may be disposed at a central portion of the middle of the case 102. The first working coil 106a may be disposed on the first base plate 108a.

The input interface 1041, and first light source unit 1043a corresponding to the first working coil 106a may be disposed on the first base plate 108a. On/In the upper portion of the first base plate 108a, the input interface 1041 may be disposed on a lower side of the first light source unit 1043a, and the first light source unit 1043a may be disposed on a lower side of the input interface 1041. The first base plate 108a may have a through hole 1081a to install the input interface 1041 and the first light source unit 1043a.

The second base plate 108b may be disposed on a right (first) side of the first base plate 108a at the middle of the case 102. The second working coil 106b and the third working coil 106c may be disposed on the second base plate 108b.

A second light source unit 1043b corresponding to the second working coil 106b and the third working coil 106c may be disposed on/in the upper portion of the second base plate 108b. On/In the upper portion of the second base plate 108b, the second working coil 106b, the third working coil 106c, and the second light source unit 1043b may be consecutively disposed. The second base plate 108b may have a through hole 1081b to install the second light source unit 1043b.

The third base plate 108c may be disposed on a left (second) side of the first base plate 108a at the middle of the case 102. The fourth working coil 106d and the fifth working coil 106e may be disposed on/in an upper portion of the third base plate 108c.

A third light source unit 1043c corresponding to the fourth working coil 106d and the fifth working coil 106e may be further disposed on/in the upper portion of the third base plate 108c. On/In the upper portion of the third base plate 108c, the fourth working coil 106d, the fifth working coil 106e, and the third light source unit 1043c may be consecutively disposed. The third base plate 108c may have a through hole 1081c to install the third light source unit 1043c.

The case 102 may have a plurality of mounting portions 1021 to mount the plurality of base plates 108a, 108b, 108c in portions of an outer circumferential surface of the case 102. That is, edges of the plurality of base plates 108a, 108b, 108c may be mounted onto tops of the plurality of mounting portions 1021. Accordingly, the plurality of base plates 108a, 108b, 108c may be disposed at the middle of the case 102.

A bracket 210 may be disposed at a central portion of a lower end of the case 102. The bracket 210 may be disposed at a central portion of a lower side of the first base plate 108a, and may prevent bending, that is, sagging of the first base plate 108a, caused by a weight of the first base plate 108a. The weight of the first base plate 108a may include a weight of the first working coil 106a on/in the upper portion of the first base plate 108a.

At least one elastic member 220 may be disposed on the bracket 210. For example, the elastic member 220 may be a leaf spring. An upper end of at least one elastic member 220 may contact a lower surface of the first base plate 108a, and may prevent sagging of the first base plate 108a. A configuration and mechanism for preventing bending are described hereinafter.

The one or more drive circuit 110a, 110b, 110c may control driving of the plurality of working coils 420 which are heating units, and may further control driving of components, such as the input interface 1041, for example, of the electric range 100.

The one or more drive circuit 110a, 110b, 110c may include various components in relation to the driving of the plurality of working coils 420. The components may include a power supply configured to supply AC power, a rectifier configured to rectify AC power of the power supply into direct current (DC) power, an inverter configured to convert DC power, rectified by the rectifier, into resonance current as a result of a switching operation and supply the resonance current to the plurality of working coil 420, a microcomputer, for example, a micom configured to control the inverter and components in relation to driving of the inverter, and a relay or a semiconductor switch configured to turn on or turn off the plurality of working coils 420, for example.

The one or more drive circuit 110a, 110b, 110c may include first drive circuit 110a, second drive circuit 110b, and third drive circuit 110c. The first drive circuit 110a may be disposed on a right (first) side of the lower end of the case 102 with respect to the bracket 210 and may control driving of the first working coil 106a. The second drive circuit 110b may be disposed on a right (first) side of the first drive circuit 110a and may control driving of the second working coil 106b and the third working coil 106c. The third drive circuit 110c may be disposed on a left (second) side of the lower end of the case 102 with respect to the bracket 210 and may control driving of the fourth working coil 106d and the fifth working coil 106e.

The one or more heat sink 112a, 112b, 112c may be disposed over a portion of the one or more drive circuit 110a, 110b, 110c and may prevent an increase in temperature of components disposed in or at a portion of the one or more drive circuit 110a, 110b, 110c. The one or more heat sink 112a, 112b, 112c may include first heat sink 112a, second heat sink 112b, and third heat sink 112c. The first heat sink 112a may prevent an increase in temperature of components installed in a portion of the first drive circuit 110a, the second heat sink 112b may prevent an increase in temperature of components installed in a portion of the second drive circuit 110b, and the third heat sink 112c may prevent an increase in temperature of components installed in a portion of the third drive circuit 110c.

The power feeder 114 may supply power from an external power source to the electric range 100. The power feeder 114 may be implemented as a terminal block, for example.

The power feeder 114 may be disposed at any one of edges of the lower end of the case 102. For example, the power feeder 114 may be disposed at an upper end of the left side of the lower end of the case 102.

The one or more filter circuit 116a, 116b, 116c may be disposed at any one of the edges of the lower end of the case 102, and may reduce noise made by the plurality of working coils 420. The one or more filter circuit 116a, 116b, 116c may include first filter circuit 116a, second filter circuit 116b, and third filter circuit 116c.

The first filter circuit 116a may reduce noise made by the first working coil 106a. The second filter circuit 116b may reduce noise made by the second working coil 106b and the third working coil 106c. The third filter circuit 116c may reduce noise made by the fourth working coil 106d and the fifth working coil 106e.

The one or more air blowing fan 118a, 118b, 118c may reduce a temperature inside of the case 102. Accordingly, the one or more air blowing fan 118a, 118b, 118c may lower a temperature of various components installed in or on the one or more drive circuits 110a, 110b, 110c.

The one or more air blowing fan 118a, 118b, 118c may include first air blowing fan 118a, second air blowing fan 118b, and third air blowing fan 118c. The first air blowing fan 118a may cool various components installed in or on the first drive circuit 110a and may further cool the light source unit 1043 corresponding to the first working coil 106a. In particular, the first air blowing fan 118a may deliver air (wind) for cooling to the first heat sink 112a over the first drive circuit 110a.

The second air blowing fan 118b may cool various components installed in or on the second drive circuit 110b and may further cool the light source unit 1043 corresponding to the second working coil 106b and the third working coil 106c. In particular, the second air blowing fan 118b may deliver air for cooling to the second heat sink 112b over the second drive circuit 110b.

The third air blowing fan 118c may cool various components installed in or on the third drive circuit 110c and may further cool the light source unit 1043 corresponding to the fourth working coil 106d and the fifth working coil 106e. In particular, the third air blowing fan 118c may deliver air for cooling to the third heat sink 112c over the third drive circuit 110c.

The one or more air blowing fan 118a, 118b, 118c may not be provided with a structure for preventing foreign substances from contacting the one or more air blowing fan 118a, 118b, 118c. The one or more air guide 900 may guide air (wind) generated by the air blowing fan 118a, 118b, 118c.

The one or more air guide 900 may include first air guide 900, second air guide 900, and third guide 900. The first air guide 900 may encircle the first heat sink 112a installed over a portion of the first drive circuit 110a and may guide (deliver) air, output from the first air blowing fan 118a, to the first heat sink 112a. The second air guide 900 may encircle the second heat sink 112b installed over a portion of the second drive circuit 110b and may guide air, output from the second air blowing fan 118b, to the second heat sink 112b. The third air guide 900 may encircle the third heat sink 112c installed over a portion of the third drive circuit 110c and may guide air, output from the third air blowing fan 118c, to the third heat sink 112c.

Elastic supporters 300 may be disposed at different positions of an upper end of the air guide 900. The elastic supporters 300 may be, for example, a leaf spring. The elastic supporters 300 may elastically support lower surfaces of the base plates 108a, 108b, 108c on/over the air guide 900. The elastic supporters 300 may support lower surfaces of central portions of the base plates 108a, 108b, 108c. For example, the elastic supporters 300 may support positions of the lower surfaces of the central portions of the working coils 420 disposed at upper ends of the base plates 108a, 108b, 108c.

Additionally, the case 102 may be provided with a supporter 200. The supporter 200 may have a bracket 210 and elastic members 220. The bracket 210 may have a predetermined length along a widthwise direction of the base plates 108a, 108b, 108c. The elastic members 220 may be disposed at a plurality of positions of an upper end of the bracket 210. The elastic members 220 each may be, for example, a leaf spring. The elastic members 220 may be disposed at a plurality of positions of the upper end of the bracket 210 and may elastically support a lower surface of a central portion of the base plate 108a, 108b, 108c. The elastic members 220 may support a position corresponding to a lower surface of a central portion of the working coil 420 at an upper end of the base plates 108a, 108b, 108c, for example.

Figure 6:
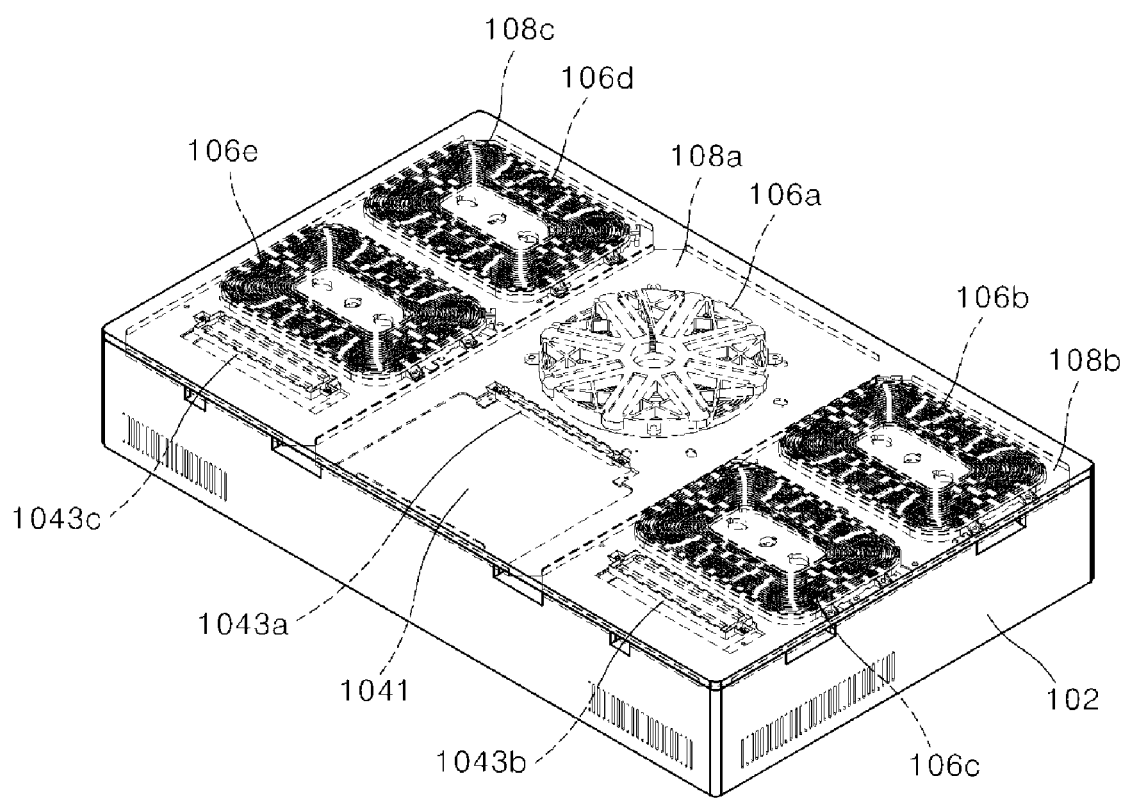
FIG. 6 is a perspective view of an electric range having an induction heating unit provided with a holder according to an embodiment.
Figure 7:
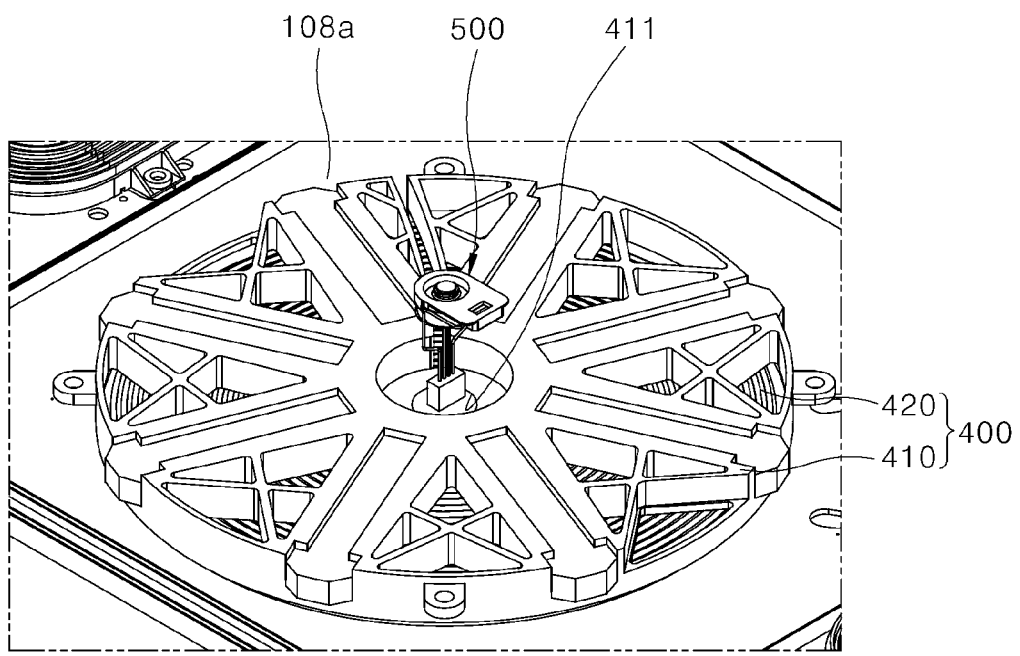
FIG. 7 is an enlarged perspective view of a holder according to an embodiment.
Figure 8:
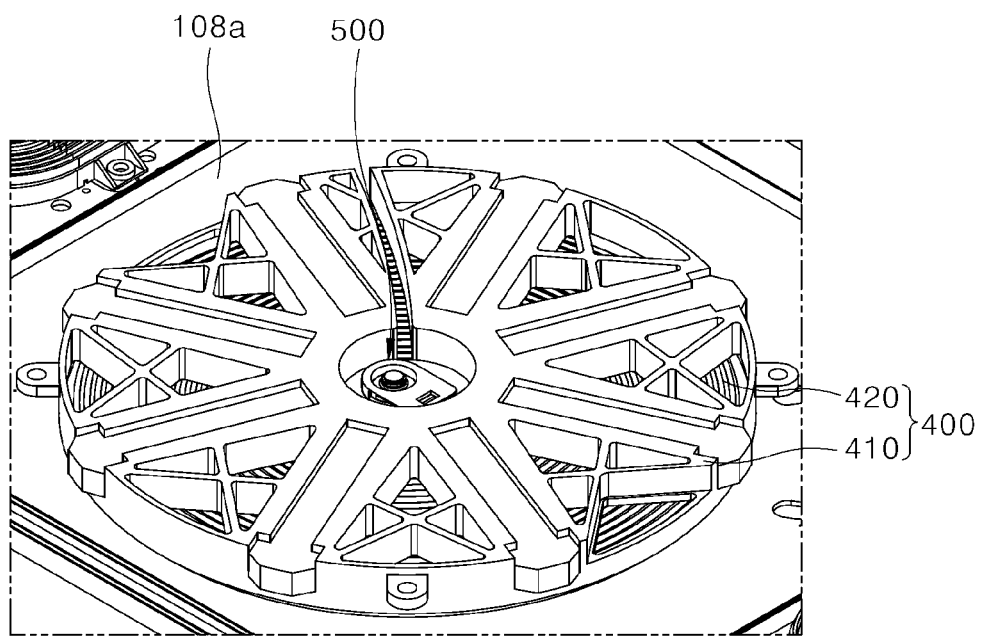
FIG. 8 is an exploded perspective view showing a coupling relationship between an induction heating unit and a holder according to an embodiment.

FIG. 6 is a perspective view of an electric range having an induction heating unit provided with a holder according to an embodiment. FIG. 7 is an enlarged perspective view of a holder according to an embodiment. FIG. 8 is an exploded perspective view showing a coupling relationship between an induction heating unit and a holder according to an embodiment.

Referring to FIG. 6, the electric range according to an embodiment may include case 102, one or more drive circuit 110a, 110b, 110c, one or more base plate 108a, 108b, 108c, induction heating unit 400, cover plate 104, and elastic holder 500. The case 102, the one or more drive circuit 100a, 110b, 110c, the one or more base plate 108a, 108b, 108c, and the cover plate 104 may have the same configurations as those described with reference to FIGS. 1 to 5.

The one or more drive circuit 110a, 110b, 110c may be disposed in the case 102. A plurality of drive circuits 110a, 110b, 110c described above may be provided.

A plurality of base plates 108a, 1089b, 108c described above may be provided. The plurality of base plates 108, 108b, 108c may be disposed at an upper end of the case 102 such that the plurality of base plates 108, 108b, 108c are adjacent to one another.

The induction heating unit 400 according to an embodiment may include working coil base 410 and working coil 420. The working coil base 410 may be disposed at an upper end of the one or more base plate 108a, 108b, 108c. The one or more base plate 108a, 108b, 108c may have an insertion hole 411 in a central portion thereof. The insertion hole 411 may have a circular shape, for example. The one or more base plate 108a, 108b, 108c may have a through hole 108d that communicates with the insertion hole 411.

The through hole 108d may be exposed to the above-described drive circuit 110a, 110b, 110c. The working coil 420 may be disposed around the insertion hole 411 in a circular shape. An upper surface of the working coil 410 may be spaced from a lower surface of the cover plate 102.

Referring to FIGS. 7 and 8, holder 500 according to an embodiment may be inserted into and fixed to the insertion hole 411 formed in the central portion of the working coil base 410. Accordingly, the holder 500 may be disposed at the center of the induction heating unit 400.

That is, the holder 500 may have a structure, in which the holder 500 is fitted into and fixed to or removed from the insertion hole 411 and the through hole 108d which are formed at a central portion of the working coil 420, above the working coil base 410.

The holder 500 may be respectively inserted into and fixed to the central portion of the first, second, third, fourth, and fifth working coils 420. The first, second, third, fourth, and fifth working coils may be indicated by the same reference numeral of "420".

Figure 9:
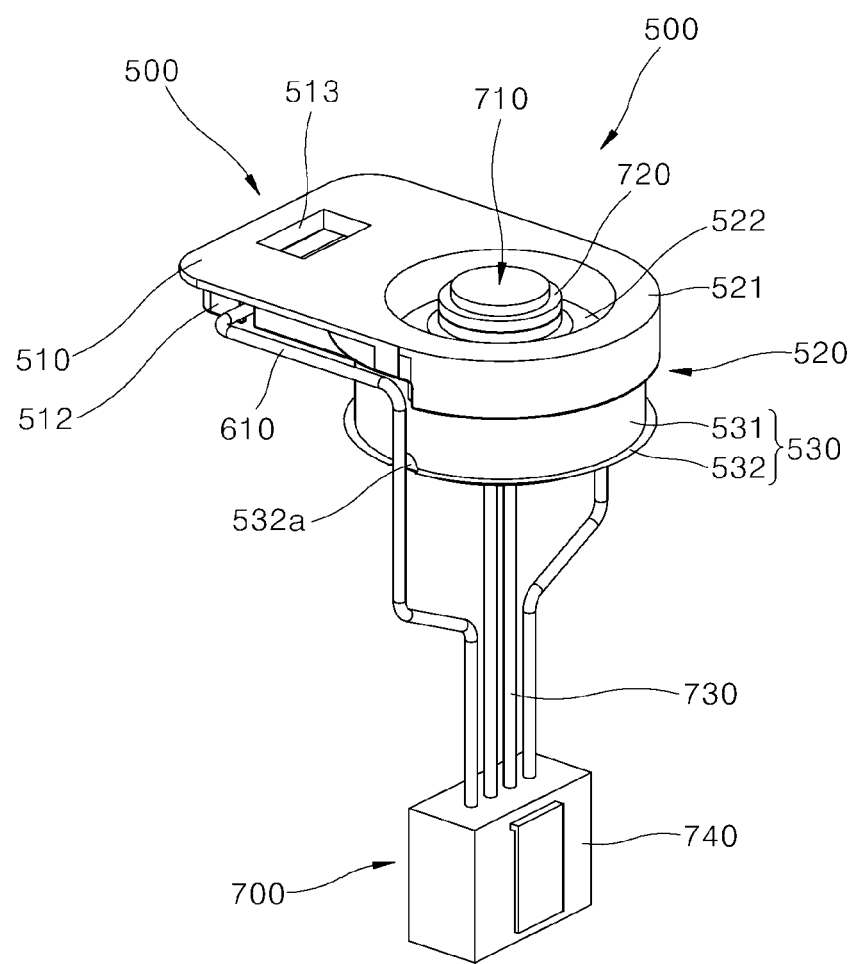
FIG. 9 is a perspective view of a holder according to an embodiment.
Figure 10:
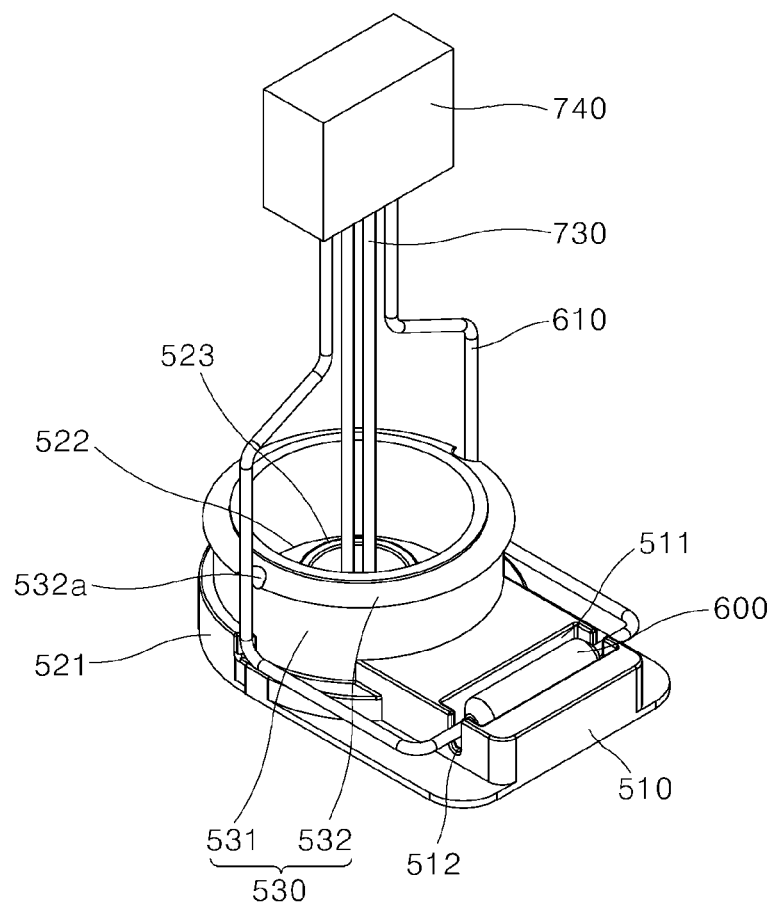
FIG. 10 is a bottom perspective view of a holder according to an embodiment.
Figure 11:
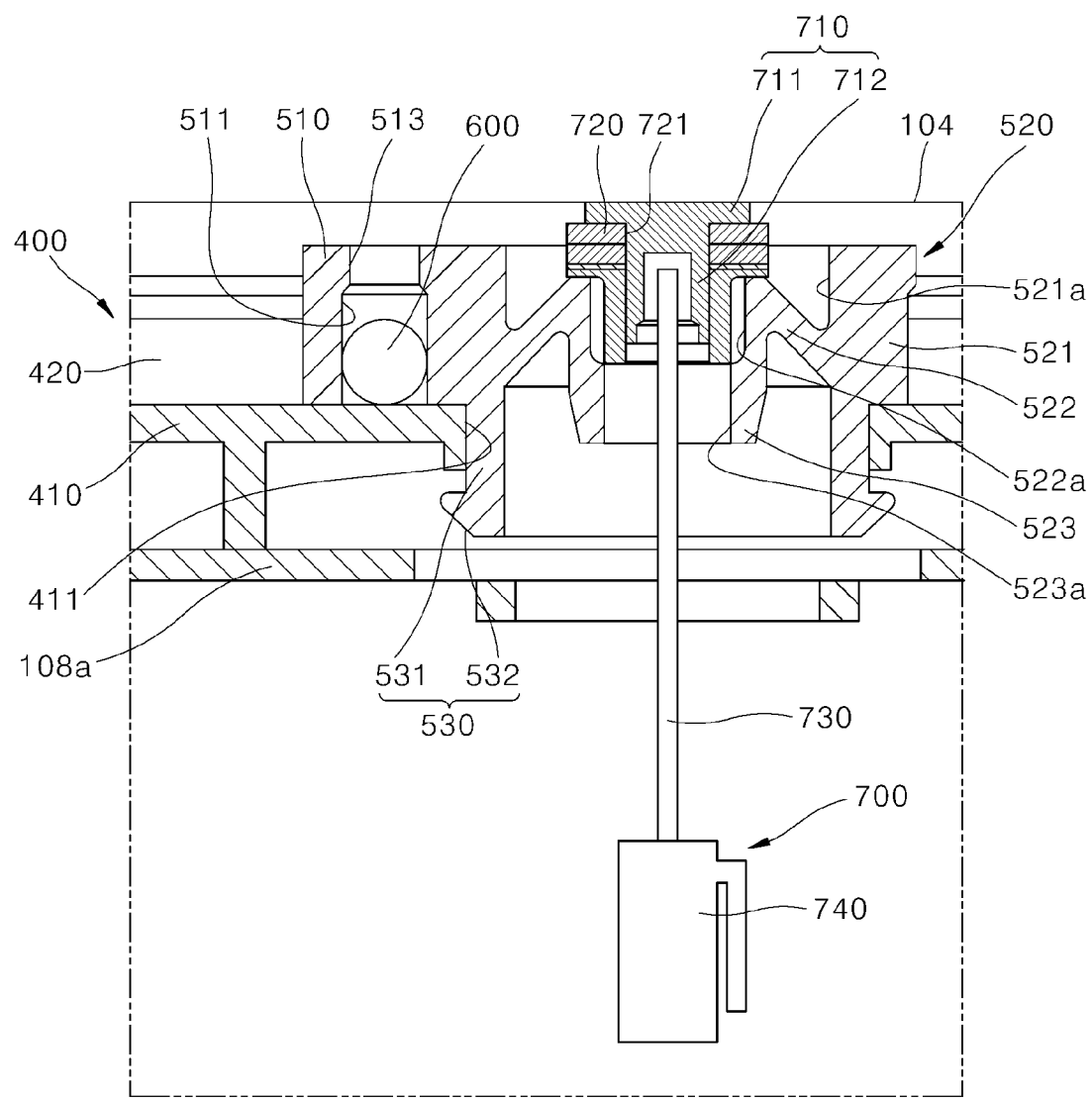
FIG. 11 is a cross-sectional view, taken along line XI-XI in FIG. 6.

FIG. 9 is a perspective view of a holder according to an embodiment. FIG. 10 is a bottom perspective view showing a holder according to an embodiment. FIG. 11 is a cross-sectional view, taken line XI-XI of in FIG. 6.

A configuration of holder 500 according to an embodiment is described with reference to FIGS. 9 to 11.

The holder 500 may be made of an elastic material, for example. The holder 500 may have insulation and thermal resistant properties.

The holder 500 may have a fuse insertion body 510, a sensor insertion body 520, and a holder body 530. The fuse insertion body 510, the sensor insertion body 520, and the holder body 530 may be integrally formed based on injection molding.

The fuse insertion body 510 is described hereinafter.

A fuse insertion groove 511 may be formed in the fuse insertion body 510. A lower portion of the fuse insertion groove 511 may be open along a downward direction of the fuse insertion body 510. A fuse 600 may be inserted into the fuse insertion groove 511 through the open lower portion of the fuse insertion groove 511.

The fuse 600 may have a predetermined length and have a circular rod-shaped body or a rectangle-shaped body, for example. The fuse insertion groove 511 may be formed into a shape corresponding to a shape of an outer circumference of the fuse 600.

Additionally, a pair of slit grooves 512 may be formed in side portions of the fuse insertion body 510. The pair of slit grooves 512 may expose both sides of the fuse insertion groove 511. The pair of slit grooves 512 may be respectively slit open a predetermined length from a lower end of the fuse insertion groove 511 to an upper end thereof.

The pair of slit grooves 512 may guide a signal line 610 connected to both ends of the fuse 600 such that the signal line 610 protrudes outward. Additionally, the pair of slit grooves 512 may guide the signal line 610 such that the signal line 610 moves in an upward-downward or vertical direction.

Further, an inner width of the fuse insertion groove 511 may be less than a width of the fuse 600. The fuse 600 may be elastically pressed against an inner wall of the fuse insertion groove 511 having elasticity. The fuse 600 may be fixed to the fuse insertion groove 511 using the elasticity. The fuse insertion body 510 may protect the fuse 600 from external impact. The fuse insertion groove 511 may be formed into a shape corresponding to a shape of a circumference of the fuse 600.

Additionally, an exposure hole 513 may be formed in or at an upper end portion of the fuse insertion body 510. The exposure hole 513 may communicate with the fuse insertion groove 511. The exposure hole 513 may have a size less than a size of the fuse insertion groove 511. The fuse 600 may be inserted into the fuse insertion groove 511. The exposure hole 513 may expose a portion of the fuse outwardly.

The sensor insertion body 520 may be integrally formed on one (first) side of the fuse insertion body 510 according to an embodiment. The sensor insertion body 520 may have an outer body 521, an extended plate body 522, and an insertion body 523. The outer body 521 may be integrally formed on the one side of the fuse insertion body 510.

The outer body 521 may have a cylindrical shape, as a whole. The outer body 521 may have a central hole 521a in an upper end portion thereof. The central hole 521a may be a circular hole, for example.

The extended plate body 522 may extend from an inner circumference of the central hole 521a along a center of the central hole 521a. The extended plate body 522 may be a circular plate, for example. The extended plate body 522 may have a circular hole 522a in a central portion thereof.

The insertion body 523 may have a cylindrical shape, for example. An upper end of the insertion body 523 having a cylindrical shape may integrally connect to an inner circumference of the circular hole 522a. The insertion body 523 may extend to a predetermined length along the downward direction. The extended plate body 522 may be inclined upward from the inner circumference of the central hole 521a toward the center of the central hole 521a.

A sensor 700 according to an embodiment may be a temperature sensor. The sensor 700 may have a sensing member 710, a ring-shaped suspension member 720, an electric cable 730, and a connector 740.

The sensing member 710 may have an upper end sensing body 711 and a lower end sensing body 712. The upper end sensing body 711 may be a circular plate, for example. The lower end sensing body 712 may be a circular rod, for example. An upper end of the lower end sensing body 712 may connect to a lower end of the upper end sensing body 711. The sensing member 710 may have a cross section of a "T" shape, as a whole. The upper end sensing body 711 and the lower end sensing body 712 may be integrally formed.

The suspension member 720 may be formed to have a hollow hole. A step or stepped portion may be formed around the suspension member 720. That is, the suspension member 720 may be formed as a hollow cylinder having a stepped portion extending from an upper end of the hollow cylinder radially outwards. The stepped portion may be supported by the sensor insertion body 520.

The lower end sensing body 712 may be fitted into the hollow hole or hollow cylinder 721 of the suspension member 720. The lower end of the upper end sensing body 711 may be suspended at or supported by an upper end of the suspension member 720, e.g. by an upper end of the hollow cylinder and/or by the stepped portion.

The suspension member 720, in particular the hollow cylinder 721 thereof, may be fitted into a hole 523a of the insertion body 523. The stepped portion of the suspension member 720 may be mounted onto the upper end of the insertion body 523.

Additionally, a circumference of the suspension member 720 may come into close contact with the hollow hole 523a of the insertion body 523. The suspension member 720, and the hollow hole 523a of the insertion body 523 may be configured to be suspended using the step. When the suspension member 720 is fitted into the hollow hole, the circumferential surface of the suspension member 720 is in close contact with the inner periphery of the hollow hole 523a.

Accordingly, the sensor 700 according to an embodiment may be fitted into and fixed to the insertion body 523 of the sensor insertion body 520. An upper surface of the sensing member 710 of the sensor 700 may protrude from the upper surface of the sensor insertion body 720. The electric cable 730 connected to the sensing member 710 may extend downward a predetermined length through the hollow hole 523a of the insertion body 523.

The holder body 530 according to an embodiment may be integrally formed with the sensor insertion body 520, e.g. at a lower end of the sensor insertion body 520. The holder body 530 may have a fitted body 531 and a jaw 532. The fitted body 531 may have a predetermined length, may have a cylindrical shape, and may be inserted into the insertion hole 411 of the induction heating object 400 or the working coil base 410.

The jaw 532 may protrude from a lower end of the fitted body 531 along an outer circumference of the fitted body 531. The jaw 532 may be held at a lower end of the insertion hole 411 formed in the induction heating unit 400. The insertion hole 411 may have a height less than a length of the fitted body 531.

Additionally, the jaw 532 may have a guide groove 532a. A number of the guide grooves 532a may correspond to a number of signal lines 610 of the fuse 600. The guide groove 532a may be a slit open on an outer circumference of the jaw 532. The signal line 610 may be fitted into the guide groove 532a and guided thereby.

The guide groove 532a may be provided at the jaw 532. In this case, the signal line 600 may pass through the guide groove 532a. The electric cable passing through the hollow hole 523a of the insertion body 523 may extend outward through a hollow hole of the holder body 530.

The connector 740 according to an embodiment may connect to an end portion of the electric cable 730. The electric cable 730 may pass through the through hole 108d formed at the base plate 108a, 108b, 108c. The connector 740 in the end portion of the electric cable 730 may connect to the drive circuit 110a, 110b, 110c in the case 102.

Figure 12:
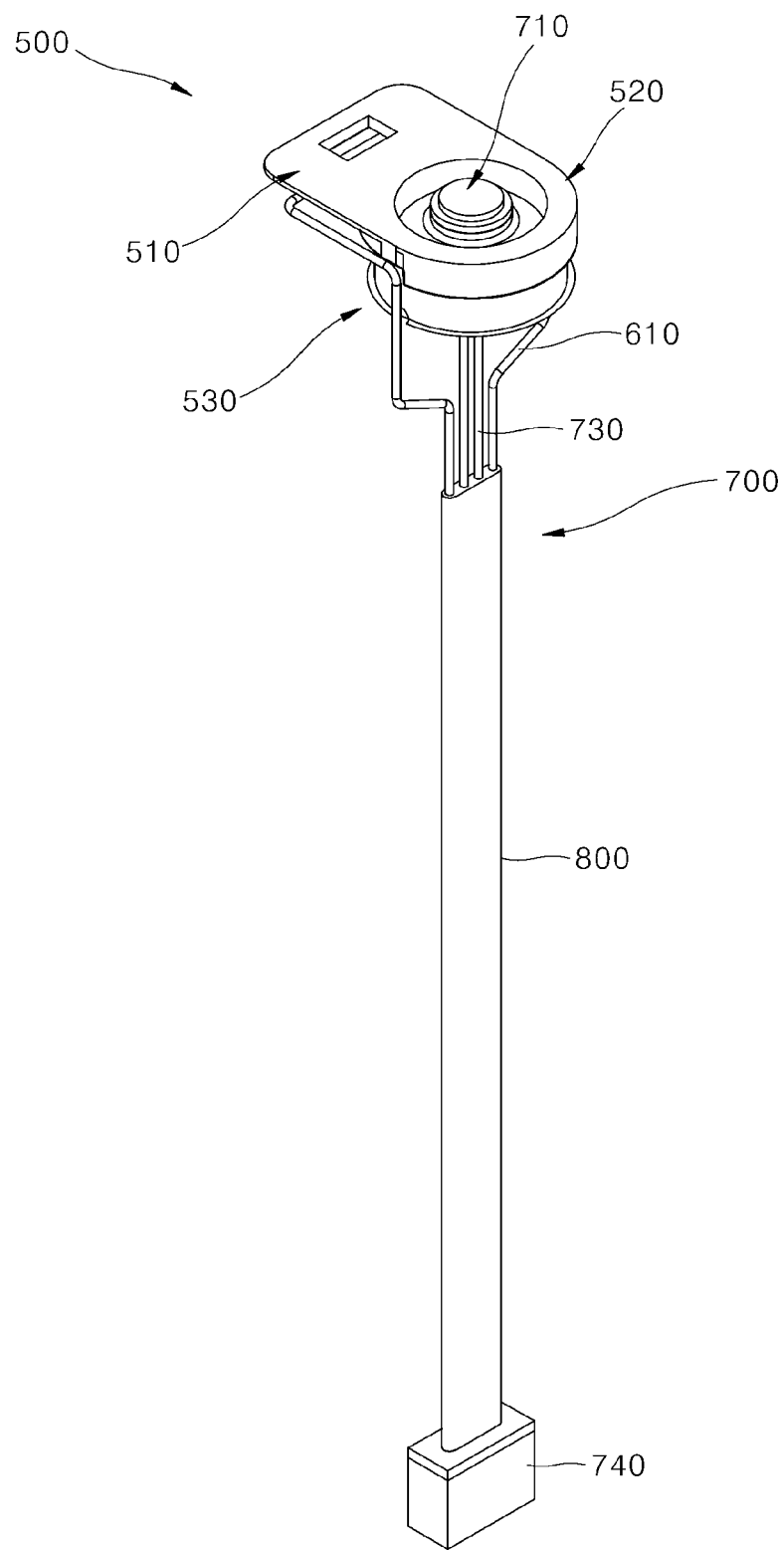
FIGS. 12 and 13 are perspective views showing an example in which a tube is fitted into an electric cable according to an embodiment.
Figure 13:
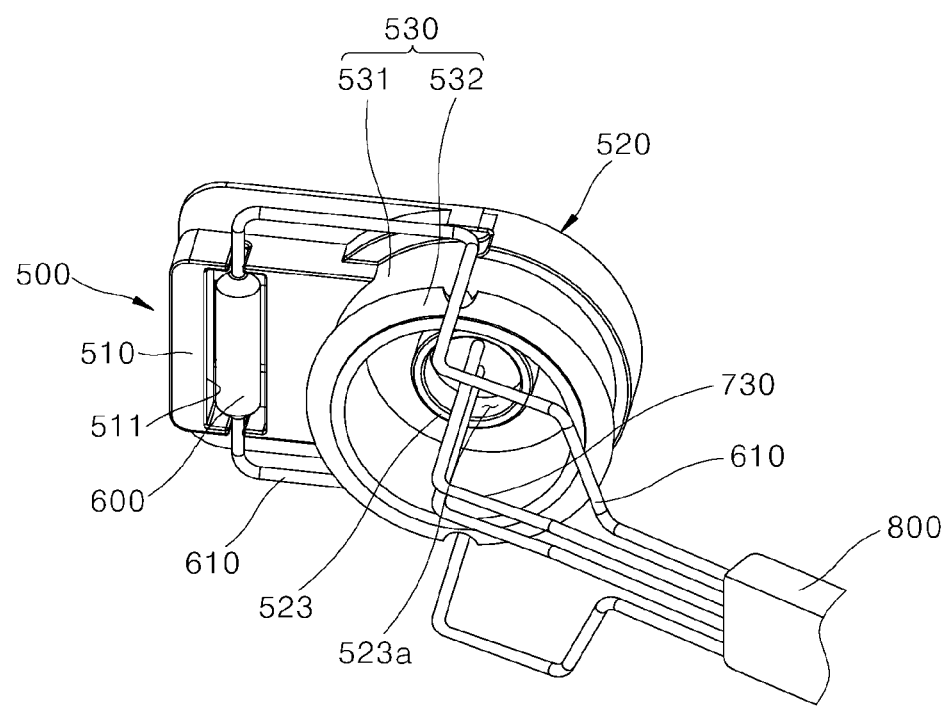

FIGS. 12 and 13 are perspective views showing an example in which a tube is fitted into an electric cable according to an embodiment.

Referring to FIGS. 12 and 13, the sensor 700 according to an embodiment may have an electric cable 730. The fuse 600 may have signal lines 610 having a predetermined length, at both ends thereof.

End portions of the electric cable 730 and the signal line 610 may connect to the connector. When the electric cable 730 and the signal line 610 have a predetermined length or greater relative to FIG. 9, the electric cable 730 and the signal line 610 may be wrapped by an insulation tube 800 having a hollow hole. The insulation tube 800 may have elasticity. Accordingly, the electric cable 730 and the signal line 610 may be elastically tightened in a state of being fitted into and surrounded by the hollow hole of the insulation tube 800 and may be tidied up. Additionally, the insulation tube 800 may protect the electric cable 730 and the signal line 610 from damage caused by an electric effect such as a spark.

According to embodiments disclosed herein, a fuse and a sensor may be provided in a single body having elasticity, and may be fitted into and installed in an insertion hole of an induction heating unit based on the above-described configurations and mechanisms, thereby ensuring ease of installation and convenience of repairs and maintenance. The sensor may be elastically supported, and an upper end of the sensor may be disposed in close contact with a lower surface of a cover plate that is an upper plate, thereby improving sensing efficiency and offsetting an impact applied to the sensor and the cover plate.

A temperature fuse and a temperature sensor may be installed in a single holder which has elasticity and is disposed at an upper end of an induction heating unit, thereby absorbing an external impact and preventing the temperature fuse and temperature sensor from escaping. The temperature sensor may elastically come into close contact with the lower surface of the cover plate, thereby preventing damage to the cover plate by an impact.

A sensing surface of an upper end of the temperature sensor may come into close contact with the lower surface of the cover plate, thereby preventing the temperature fuse from begin blown when the temperature sensor overheats due to damage to the temperature sensor.

Embodiments disclosed herein are directed to an electric range in which a temperature fuse and a temperature sensor are installed in a single holder that has elasticity and is disposed at an upper end of an induction heating unit, thereby absorbing an external impact and preventing the temperature fuse and the temperature sensor from escaping. Embodiments disclosed herein are also directed to an electric range in which the temperature sensor elastically comes into close contact with a lower surface of a cover plate, thereby preventing damage to the cover plate by an impact.

Embodiments disclosed herein are also directed to an electric range in which a sensing surface of an upper end of the temperature sensor comes into close contact with the lower surface of the cover plate, thereby preventing the temperature fuse from begin blown when the temperature sensor overheats due to damage to the temperature sensor.

Advantages are not limited to the above ones, and other advantages not mentioned above may be clearly understood from the description and can be more clearly understood from the embodiments set forth herein. Additionally, the advantages may be realized via means and combinations thereof that are described in the appended claims.

An electric range according to embodiments disclosed herein may include an elastic holder for fixing a fuse and a sensor in a central portion of an induction heating unit disposed on a base plate, thereby stably fixing the fuse and sensor against an external impact. An upper end of the sensor according to embodiments disclosed herein may come into close contact with a lower surface of a cover plate disposed over/on/in an upper portion of an induction heating apparatus, thereby stably measuring temperature of the cover plate and absorbing an external impact.

According to embodiments disclosed herein, a temperature fuse and a temperature sensor may be installed in a single holder that has elasticity and is disposed at an upper end of an induction heating apparatus, thereby absorbing an external impact and preventing the temperature fuse and the temperature sensor from escaping. The temperature sensor may elastically come into close contact with a lower surface of a cover plate, thereby preventing damage to the cover plate by an impact. A sensing surface of an upper end of the temperature sensor may come into close contact with the lower surface of the cover plate, thereby preventing the temperature fuse from begin blown when the temperature sensor overheats due to damage to the temperature sensor.

The embodiments are described above with reference to a number of illustrative embodiments thereof. However, the embodiments are not intended to limit the embodiments and drawings set forth herein, and numerous other modifications and embodiments can be devised by one skilled in the art without departing from the technical spirit. Further, the effects and predictable effects based on the configurations are to be included within the range though not explicitly described in the description of the embodiments.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element (s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to "one embodiment," "an embodiment," "example embodiment," etc., means that a particular feature, structure, or characteristic described in connection with the embodiment is included in at least one embodiment. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the idea and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electric range, comprising:
   a case having an upper portion which is open and having an inner space;
   at least one drive circuit disposed in the inner space of the case;
   at least one base plate disposed in the upper portion of the case;
   at least one induction heating unit disposed on an upper portion of the base plate;
   a cover plate disposed at an upper portion of the at least one induction heating unit; and
   an elastic holder disposed in the at least one induction heating unit, and configured to accommodate a fuse and a sensor at different positions in a single body, wherein the sensor contacts a lower surface of the cover plate, wherein the at least one induction heating unit comprises:

a working coil base disposed on the base plate and having an insertion hole at a central portion of the working coil base, and a working coil configured to form a circle that surrounds the insertion hole and is disposed on the working coil base, wherein a lower end of the elastic holder is fitted into and installed in the insertion hole, and an upper end of the elastic holder protrudes from an upper portion of the working coil, wherein the elastic holder comprises:

a fuse insertion body having a fuse insertion groove configured to have the fuse inserted within the fuse insertion groove, a sensor insertion body provided at one side of the fuse insertion body, and having an open upper portion, and the sensor insertion body having a sensor insertion hole configured to have the sensor inserted within the sensor insertion hole, and a holder body provided at a lower end of the sensor insertion body and fitted into and held in the sensor insertion hole, wherein a lower portion of the fuse insertion groove is open in a downward direction from the fuse insertion body, and the fuse to be inserted into the fuse insertion groove through the open lower portion of the fuse insertion groove, wherein an upper end portion of the fuse insertion body includes an exposure hole configured to expose the fuse insertion groove outward, a size of the exposure hole is less than a size of the fuse insertion groove, and the exposure hole configured to outwardly expose a portion of the fuse in the fuse insertion groove.

2. The electric range of claim 1, wherein an inner width of the fuse insertion groove is less than a width of the fuse.

3. The electric range of claim 1, wherein the fuse insertion body has a pair of slit grooves configured to expose both sides of the fuse insertion groove outwardly, and each of the pair of slit grooves extends from a lower end of the fuse insertion groove toward an upper end of the fuse insertion groove by a predetermined length.

4. The electric range of claim 3, wherein the sensor insertion body comprises:

an outer body having a cylindrical shape, an extended plate body having a ring shape and extending radially inwards from the outer body, and an insertion body having a cylindrical shape and extending from the extended plate body towards the base plate.

5. The electric range of claim 4, wherein an outer circumference of an upper end of the insertion body is connected to a central portion of the extended plate body, and a lower end of the insertion body extends a predetermined length to be disposed at a lower side of the extended plate body.

6. The electric range of claim 4, wherein the outer body has a central hole, and the extended plate body is inclined upward from an inner circumference of the central hole toward a center of the central hole.

7. The electric range of claim 3, wherein the holder body comprises:

a fitted body having a cylindrical shape and having a predetermined length, and the fitted body is inserted into the insertion hole, and a jaw formed on an outer circumference of a lower end of the fitted body and held at a lower end of the insertion hole, and wherein a height of the insertion hole is less than a length of the fitted body.

8. The electric range of claim 7, wherein at least one signal line is to connect to the fuse, wherein the jaw has one or more guide grooves, and wherein the at least one signal line is provided in the one or more guide grooves.

9. The electric range of claim 8, wherein the at least one signal line passes through the pair of slit grooves.

10. The electric range of claim 1, wherein the sensor comprises:

a suspended member having a ring shape and suspended at the sensor insertion body, a sensing member that passes through the suspended member and an upper end of which is exposed at an upper end of the suspended member, an electric cable electrically connected to the sensing member, and extended through a hollow hole of the holder body, and a connector installed at an end of the electric cable and connected to the at least one drive circuit, and wherein an upper surface of the sensing member contacts a lower surface of the cover plate.

11. The electric range of claim 10, wherein the upper surface of the sensing member is disposed higher than an upper surface of the fuse insertion body, and the upper surface of the sensing member is disposed higher than an upper surface of the sensor insertion body.

12. The electric range of claim 10, wherein an insulation tube is to surround the electric cable.

13. The electric range of claim 1, wherein the fuse insertion body and the sensor insertion body protrude from an upper end of the working coil base.

* * * * *